United States Patent
Agrawal et al.

(10) Patent No.: US 7,913,125 B2
(45) Date of Patent: Mar. 22, 2011

(54) BISR MODE TO TEST THE REDUNDANT ELEMENTS AND REGULAR FUNCTIONAL MEMORY TO AVOID TEST ESCAPES

(75) Inventors: Ghasi R. Agrawal, Sunnyvale, CA (US); Mukesh K. Puri, Fremont, CA (US)

(73) Assignee: LSI Corporation, Milpitas, CA (US)

( * ) Notice: Subject to any disclaimer, the term of this patent is extended or adjusted under 35 U.S.C. 154(b) by 438 days.

(21) Appl. No.: 10/701,332

(22) Filed: Nov. 4, 2003

(65) Prior Publication Data
US 2005/0097417 A1    May 5, 2005

(51) Int. Cl.
*G11C 29/00* (2006.01)
(52) U.S. Cl. .................. 714/710; 714/703
(58) Field of Classification Search .................. 714/718; 365/200–201
See application file for complete search history.

(56) References Cited

U.S. PATENT DOCUMENTS

| | | | | |
|---|---|---|---|---|
| 5,835,431 A | * | 11/1998 | Miner et al. | 365/201 |
| 5,841,709 A | * | 11/1998 | McClure | 365/200 |
| 6,640,321 B1 | | 10/2003 | Huang et al. | |
| 6,661,719 B1 | * | 12/2003 | Shih et al. | 365/201 |
| 6,961,880 B2 | * | 11/2005 | Frankowsky | 714/718 |
| 6,999,357 B2 | * | 2/2006 | Tanishima et al. | 365/200 |
| 2003/0237061 A1 | * | 12/2003 | Miller et al. | 716/4 |

* cited by examiner

*Primary Examiner* — Robert Beausoliel
*Assistant Examiner* — Steve Nguyen
(74) *Attorney, Agent, or Firm* — Clark Hill PLC

(57) ABSTRACT

A BISR mode and associated method for testing memory. All redundant elements of the memory including the ones which are not used are tested, and interaction between redundant elements of the memory and adjacent functional memory are checked. Repair information is used to repair the memory. In addition, redundant elements which are not needed to be used for repairing the memory are forced to be used, such as by faking defects to remap good elements with redundant elements.

10 Claims, 3 Drawing Sheets

BISR MODE TO TEST THE REDUNDANT ELEMENTS AND REGULAR FUNCTIONAL MEMORY TO AVOID TEST ESCAPES

BACKGROUND OF THE INVENTION

The present invention generally relates to Built-in-self repair (BISR) designs, and more specifically relates to a BISR design which is configured to test redundant elements and regular functional memory to avoid test escapes.

BISR detects and repairs defects in memories. Testing of redundant locations is an important aspect of the BISR algorithm. It is not always very easy to test redundant locations completely.

A current solution is to bitmap all the failures and post-process it to determine whether or not the failure is related to defects in redundant locations. However, it is almost impossible to bitmap all failing memories in the production flow. This significantly impacts tester time and increases cost. Another current solution is to check the unused redundant elements along with the functional space next to them via BIST. However, using BIST to test limited addresses results in a very complicated algorithm, increases gate count and can potentially impact yield.

Huang et al. had proposed a method to test the redundant elements along with regular memory in U.S. Pat. No. 6,640,321. U.S. Pat. No. 6,640,321 is hereby incorporated herein by reference in its entirety. The method proposed in that patent is useful for memories which employ only redundant rows. The basic idea is to generate Built-in-self-test (BIST) with additional words (more than the actual functional space) and use the additional words access to access the redundant elements during BIST run. The method requires complicated masking of false failure during Built-in-self-repair (BISR) and BIST runs. These failures occur because BIST tries to test more words then existing in the functional space all the time. Moreover, it becomes very complicated if we have both redundant rows and redundant columns. It also requires special design in the memory to support this method.

In another method, redundant elements are remapped to repair the defective elements on the fly as soon as the defective elements are assessed. BIST run is then re-started from where it was stopped. This requires special BIST design and handling and will be impossible to achieve with third party BIST designs. Moreover, it is almost impossible to assess the replacement of defects with either row or column (in case of row and column redundancy) since the actual assignments of redundant rows or columns are done at the end. This method still has potential test escapes because of not getting proper background physical patterns.

OBJECTS AND SUMMARY OF THE INVENTION

A general object of an embodiment of the present invention is to provide a BISR design which allows for the testing of redundant locations, including the unused ones, in the manufacturing flow.

Briefly, an embodiment of the present invention provides a BISR mode and associated method for testing memory. Redundant elements of the memory which are not used are also tested, and interaction between redundant elements of the memory which are not used and adjacent functional memory are also checked. Repair information is used to repair the memory and redundant elements which are not needed to be used for repairing the memory are forced to be used, such as by faking defects to remap good elements with redundant elements.

BRIEF DESCRIPTION OF THE DRAWINGS

The organization and manner of the structure and operation of the invention, together with further objects and advantages thereof, may best be understood by reference to the following description, taken in connection with the accompanying drawings, wherein.

DESCRIPTION

Figure 1:
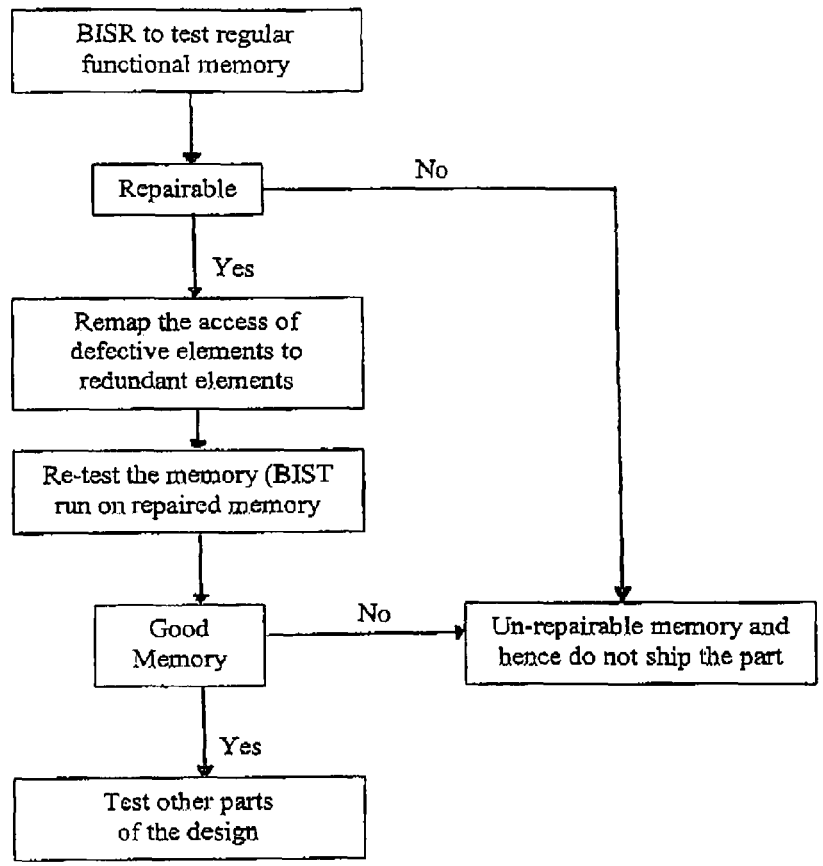
FIG. 1 is a flow chart which illustrates the test flow of a prior art method.

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

BISR circuitry is used to repair defects found in memories. BISR uses BIST to test the memory. Based on the BIST run BISR assigns the redundant elements to replace the defective elements. Typically, memory gets re-tested after repair and if the memory is still found defective, then the memory is classified as un-repairable. If it passes the BIST, then it is classified as repairable.

It is important to note that the second BIST run tests the good regular functional memory and only the redundant elements which are used to replace the defective elements in regular memory. However, it does not test redundant elements which are not used. Moreover, it does not check the interaction between redundant elements (which are not used) and adjacent regular memory. FIG. 1 shows an existing typical flow for testing of memories.

The present invention can be used for any type of redundancy. It does require extra BIST run to check redundant memory space. However, BIST can be run only on redundant memory space along with adjacent redundant elements space. However, it is very difficult to design a special BIST to test just redundant elements and adjacent memory elements because it complicates the algorithm and increases the gate count. A complete BIST run can also be run if a special BIST run for redundant memory and adjacent memory locations can not be designed.

The present invention provides a special mode in the BISR design. This mode uses the repair information generated during the BISR run to repair the memory. It also forces the usage of the other redundant elements which are not needed to be used for repairing the memory. Redundant elements do not really have any direct control in terms of functional access. The only way these elements can be accessed is by faking some defects to remap the good elements (because of fake defects) with redundant elements. This way when we run BIST on repaired memory then we not only test (write/read) the redundant memory but also the portion of regular functional memory which is placed in the design close to the redundant memory. This way we can make sure we not only test the redundant memory for failures but also interaction between redundant memory and adjacent functional memory is also tested. A possible flow of testing is depicted in FIG. 2.

Figure 2:
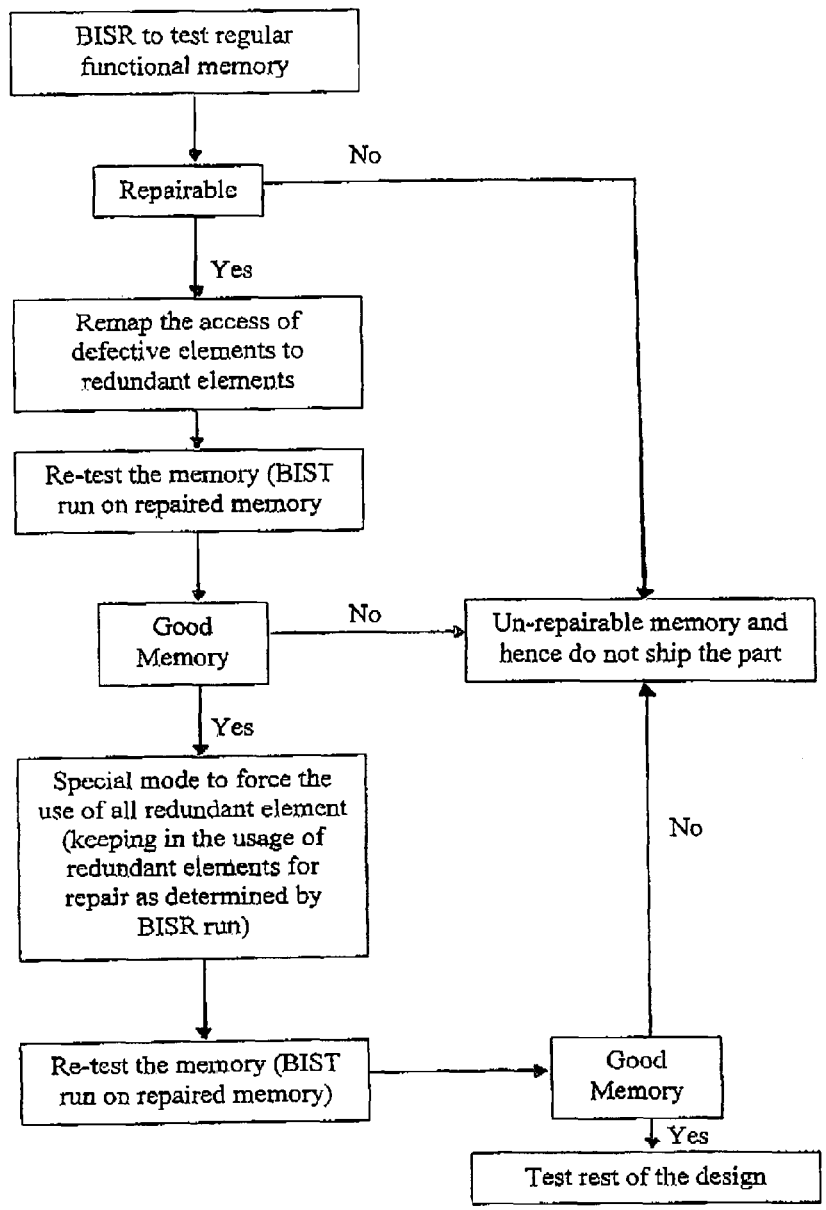
FIG. 2 is a flow chart which illustrates the test flow of a method which is in accordance with an embodiment of the present invention.
Figure 3:
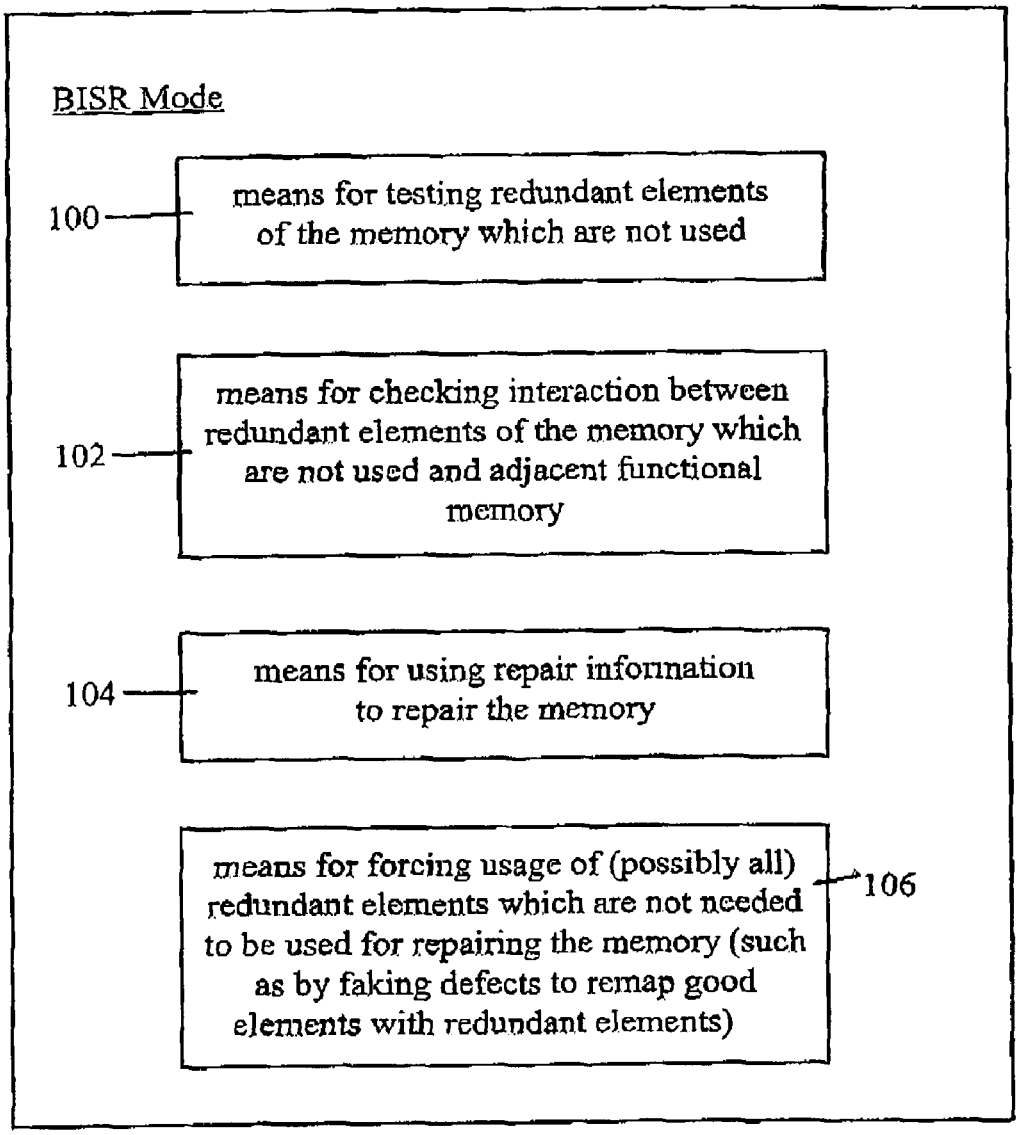
FIG. 3 is a block diagram of a BISR mode which is in accordance with an embodiment of the present invention.

FIG. 3 illustrates a special BISR mode which can be utilized to practice the method shown in FIG. 2. As shown, the BISR mode includes means for testing redundant elements of the memory which are not used (block 100); means for checking interaction between redundant elements of the memory which are not used and adjacent functional memory (block 102); means for using repair information to repair the memory (block 104); and means for forcing usage of (possibly all) redundant elements which are not needed to be used for repairing the memory (such as by faking defects to remap good elements with redundant elements) (block 106).

As such, the present invention provides a special design feature to add access to the redundant elements which are not being used in the memory. The feature allows BIST to be run and a single signal (GO) to be generated to determine whether or not the memory is repairable. This way, regular functional memory and redundant memory can be tested comprehensively. An alternate method involves designing a special BIST mode to force usage of all the redundant elements and also designing a special BIST mode to tell if the failure seen is associated with redundant elements or not. Even then, there will be a possibility of potential test escapes.

While an embodiment of the present invention is shown and described, it is envisioned that those skilled in the art may devise various modifications of the present invention without departing from the spirit and scope of the appended claims.

What is claimed is:

1. A method for testing memory, said method comprising:
    performing a first test, wherein functional memory is tested;
    repairing the functional memory by adding access to redundant elements, thereby providing repaired functional memory;
    performing a second test, wherein the repaired functional memory is tested;
    after repairing the functional memory and after testing the repaired functional memory, adding access to redundant memory not required for repair of the functional memory; and
    after testing the repaired functional memory and then adding access to redundant memory not required for repair of the functional memory, performing a third test, wherein the redundant memory is tested, wherein the step of adding access to redundant memory which is not required for the repair comprises faking defects to remap good elements with redundant elements.

2. A method as recited in claim 1, further comprising using repair information to repair the functional memory.

3. A method as recited in claim 1, wherein the step of adding access to redundant memory which is not required for the repair comprises forcing usage of redundant elements which are not needed to be used for repairing the functional memory.

4. A method as recited in claim 1, further comprising checking interaction between redundant elements of the memory which are not used and adjacent functional memory.

5. A method as recited in claim 1, wherein the step of adding access to redundant memory not required for repair of the functional memory comprises adding access to all remaining redundant memory, and wherein the step of performing a third test comprises testing all the remaining redundant memory.

6. A mode for testing memory, said mode comprising:
    means for performing a first test, wherein functional memory is tested;
    repairing the functional memory by adding access to redundant elements thereby providing repaired functional memory;
    means for performing a second test, wherein the repaired functional memory is tested;
    means for, after repairing the functional memory and after testing the repaired functional memory, adding access to redundant memory not required for repair of the functional memory by faking defects to remap good elements with redundant elements; and
    means for, after testing the repaired functional memory and then adding access to redundant memory not required for repair of the functional memory, performing a third test, wherein the redundant memory is tested.

7. A mode as recited in claim 6, further comprising means for using repair information to repair the functional memory.

8. A mode as recited in claim 6, further comprising means for forcing usage of redundant elements which are not needed to be used for repairing the functional memory.

9. A mode as recited in claim 6, further comprising means for checking interaction between redundant elements of the memory which are not used and adjacent functional memory.

10. A mode as recited in claim 6, wherein the means for adding access to redundant memory not required for repair of the functional memory comprises means for adding access to all remaining redundant memory, and wherein the means for performing a third test comprises means for testing all the remaining redundant memory.

* * * * *